(12) United States Patent
Reed (10) Patent No.: US 8,680,912 B2
(45) Date of Patent: Mar. 25, 2014

(54) LEVEL SHIFTING CIRCUITRY

(75) Inventor: Brian William Reed, San Jose, CA (US)

(73) Assignee: ARM Limited, Cambridge (GB)

( * ) Notice: Subject to any disclaimer, the term of this patent is extended or adjusted under 35 U.S.C. 154(b) by 56 days.

(21) Appl. No.: 13/551,012

(22) Filed: Jul. 17, 2012

(65) Prior Publication Data

US 2014/0021999 A1   Jan. 23, 2014

(51) Int. Cl.
*H03L 5/00* (2006.01)

(52) U.S. Cl.
USPC ................ 327/333; 327/112; 326/68; 326/81

(58) Field of Classification Search
USPC ........ 327/108, 112, 333, 427; 326/68, 80, 81; 365/189.11
See application file for complete search history.

(56) References Cited

U.S. PATENT DOCUMENTS

| 4,486,670 | A | | 12/1984 | Chan et al. |
| 5,113,097 | A | | 5/1992 | Lee |
| 6,002,290 | A | * | 12/1999 | Avery et al. .................... 327/333 |
| 7,679,421 | B1 | * | 3/2010 | Hsu .............................. 327/333 |
| 7,973,560 | B2 | | 7/2011 | Kuge |

* cited by examiner

*Primary Examiner* — Long Nguyen
(74) *Attorney, Agent, or Firm* — Nixon & Vanderhye P.C.

(57) ABSTRACT

Level shifting circuitry is provided for generating an output signal in response to an input signal. The level shifting circuitry includes a pulldown path for pulling the output signal to a lower output voltage level in response to a first transition of the input signal and a pullup path for pulling the output signal to a higher output voltage level in response to a second transition of the input signal. Pullup control circuitry places the pullup path in a non-conductive state in response to the output signal being pulled to the higher output voltage level. A keeper path keeps the output signal at the higher output voltage level while the pullup path is non-conductive until the pulldown path pulls the output signal low. A maximum drive current of the pulldown path is greater than a maximum drive current of the keeper path.

15 Claims, 11 Drawing Sheets

LEVEL SHIFTING CIRCUITRY

BACKGROUND TO THE INVENTION

1. Field of the Invention

The present invention relates to the field of data processing. More particularly, the invention relates to level shifting circuitry.

2. Description of the Prior Art

Figure 1:
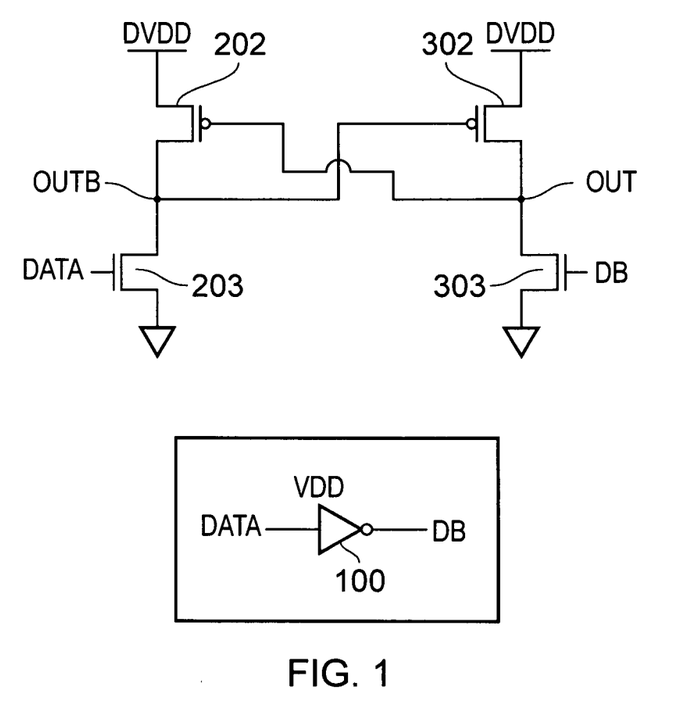
FIG. 1 shows a typical cross-coupled level shifter.

Different portions of an integrated circuit may operate at different voltage levels. To convert between signals in one voltage domain and signals in another voltage domain, level shifting circuitry may be used. FIG. 1 of the accompanying drawings shows a typical level shifter comprising two pullup transistors 202, 302 and two pulldown transistors 203, 303. The input signal DATA switches between VDD and ground voltage levels. In response to the input signal, the level shifting circuitry generates an output signal which switches between DVDD and ground voltage levels. In response to a rising edge of the input signal DATA, pulldown transistor 203 pulls node OUTB to ground, which switches on pullup transistor 302, pulling the output signal OUT to DVDD. In contrast, in response to a falling edge of the input signal DATA, the signal DB, which is an inverted version of the input signal, turns on pulldown transistor 303, which pulls the output signal OUT to ground.

A problem arising with the level shifter shown in FIG. 1 is that even though pullup devices 202, 302 are the pullup devices for the output nodes OUT, OUTB, the pullup transistors 202, 302 must be sized so that the pulldown transistors 203, 303 can overcome them when the output nodes OUT, OUTB need to be switched to the ground voltage level. This is particularly a problem when the input voltage domain uses a low VDD level, in which case the threshold voltage of pulldown transistors 203, 303 may be high compared to VDD so that the VDD level of the input signal DATA and the inverse input signal DB barely turns on the pulldown transistors 203, 303. At this point, the level shifter fails because the pulldown transistors 203, 303 can no longer overcome the pullup transistors 202, 302.

Therefore, the level shifter shown in FIG. 1 generally requires the VDD level to be sufficiently high to allow the pulldown transistors 203, 303 to overcome the pullup transistors 202, 302. This limits the extent to which the VDD level in the input voltage domain can be reduced, limiting the amount of power saving that is possible. Therefore, the present technique seeks to provide level shifting circuitry which can address this problem and operate with an input voltage domain having a relatively low upper voltage level VDD.

SUMMARY OF THE INVENTION

Viewed from one aspect, the present invention provides level shifting circuitry for generating an output signal in response to an input signal, said input signal having one of a lower input voltage level and a higher input voltage level, and said output signal having one of a lower output voltage level and a higher output voltage level; said level shifting circuitry comprising:
 a pulldown path configured to pull said output signal to said lower output voltage level in response to a first transition of said input signal, said first transition comprising one of a rising transition from said lower input voltage level to said higher input voltage level and a falling transition from said higher input voltage level to said lower input voltage level;
 a pullup path configured to pull said output signal to said higher output voltage level in response to a second transition of said input signal, said second transition comprising the other of said rising transition and said falling transition of said input signal;
 pullup control circuitry configured to place said pullup path in a non-conductive state in response to said pullup path pulling said output signal to said higher output voltage level; and
 a keeper path configured to keep said output signal at said higher output voltage level while said pullup path is in said non-conductive state until said pulldown path pulls said output signal to said lower output voltage level;
 wherein a maximum drive current of said pulldown path is greater than a maximum drive current of said keeper path.

The level shifting circuitry receives an input signal having one of a lower input voltage level (e.g. ground) and a higher input voltage level (e.g. VDD). In response to the input signal, the level shifting circuitry generates an output signal having one of a lower output voltage level (e.g. ground) and a higher output voltage level (e.g., DVDD). In response to one of a rising transition and a falling transition of the input signal, a pulldown path pulls the output signal to the low output voltage level. In response to the other transition of the input signal, a pullup path pulls the output signal to the higher output voltage level.

To address the problem discussed above with reference to FIG. 1, pullup control circuitry is provided for placing the pullup path in a non-conductive state in response to the pullup path pulling the output signal to the higher output voltage level. Also, a keeper path is provided for keeping the output signal at the higher output voltage level while the pullup path is in the non-conductive state until the pulldown path pulls the output signal to the lower output voltage level. A maximum drive current of the pulldown path is greater than a maximum drive current of the keeper path.

Since the pullup path is made non-conductive after it has pulled the output signal to the higher output voltage level, the pullup path is no longer in competition with the pulldown path when the output signal later needs to be pulled down to the lower output voltage level. Instead, the pulldown path only needs to overcome the weaker keeper path, and so even if the higher input voltage level of the input signal is relatively low in comparison to the threshold voltage of the pulldown path, the pulldown path can still pull the output signal to the lower output voltage level. That is, the pullup part of the circuitry comprises two paths: a pullup path which can be sized in order to pull the output signal to the higher output voltage level, without needing to consider the competition with the pulldown path; and a keeper path sized so that it can easily be overcome by the pulldown path, without needing to consider pulling the output signal to the higher output voltage level.

Therefore, the present technique provides level shifting circuitry which is able to operate correctly even when the higher input voltage level of the input signal is relatively low. Hence, the present technique enables greater power savings to be achieved, since the level shifting circuitry allows the input voltage domain to operate with a lower voltage than the level shifter shown in FIG. 1.

As mentioned above, the maximum drive current of the pulldown path is greater than the maximum drive current of the keeper path. Put another way, the drive strength of the pulldown path is stronger than the drive strength of the keeper path. The maximum drive current of the respective paths can be controlled in different ways. For example, the pulldown path may comprise at least one transistor having a wider conduction channel than at least one transistor of the keeper path. Alternatively, transistors with different configurations may be used in the pulldown path and the keeper path so that the maximum current which can flow through the pulldown path is greater than the maximum current which can flow through the keeper path. By ensuring that the pulldown path can pass a greater current than the keeper path, the pulldown path can easily overcome the keeper path when pulling the output signal to the lower output voltage level.

The pullup control circuitry may control the state of the pullup path in a variety of ways. However, one convenient technique is for the pullup control circuitry to control placing the pullup path in the non-conductive state in dependence on the output signal, since the value of the output signal itself can identify when the output signal is about to be pulled down by the pulldown path, at which point the pullup path is made non-conductive. For example, the pullup path may be rendered non-conductive shortly after the output signal has been pulled to the higher output voltage level, to prepare the level shifting circuitry for the pulldown transition of the output signal, when the pulldown path competes with the keeper path but not the pullup path.

The pulldown path, pullup path and keeper path may be formed in different ways. Different level shifter designs may have different numbers and arrangements of transistors. However, a simple way of arranging the pullup path is to provide a pullup transistor and an isolating transistor arranged in series between an output node for outputting the output signal and a supply rail for supplying the higher output voltage level. The pullup path as a whole is conductive when both the isolating transistor and the pulldown transistor are on, and is non-conductive when at least one of the isolating transistor and pulldown transistor is off.

The pullup transistor may switch to a conductive state in response to the second transition of the input signal and may switch to a non-conductive state in response to the first transition of the input signal. Also, the isolating transistor may be switched to a non-conductive state in response to the pullup path pulling the output signal to the higher output voltage level, and may be switched to a conductive state in response to the pulldown path pulling the output signal to the lower output voltage level. In this way, the pullup transistor responds to the transitions of the input signal, while the isolating transistor isolates the pullup transistor from either the output node or the higher output voltage supply rail in advance of the pulldown transition of the output signal, so that the pullup transistor will not compete with the pulldown path during the pulldown transition. The isolating transistor effectively removes the effect of the pullup transistor from the level shifter during the pulldown transition.

As mentioned above, the pulldown path has a greater maximum drive current than the keeper path. Although not essential, the pullup path may also have a greater maximum drive current than the keeper path. In this way, a faster pullup transition may be provided.

The level shifting circuitry may be used to convert between signals passing between any two voltage domains. However, the level shifting circuitry is particularly useful when the voltage domains are such that the higher output voltage level is greater than the higher input voltage level, since it is in this situation that the problem discussed above with respect to FIG. 1 is most significant. The present level shifting circuitry may also be useful when a voltage difference between the higher output voltage level and lower output voltage level is greater than a voltage difference between the higher input voltage level and lower input voltage level.

Viewed from another aspect, the present invention provides a level shifter comprising first level shifting circuitry and second level shifting circuitry according to the first aspect of the invention, wherein the input signal of the first level shifting circuitry and the input signal of the second level shifting circuitry are complementary signals of opposite polarity; and the output signal of the first level shifting circuitry and the output signal of the second level shifting circuitry are complementary signals of opposite polarity.

It is possible to provide a level shifting circuitry with just a single pulldown path and a single pullup path as discussed above. For example, if it is only important for the level shifting circuitry to react quickly to one of the rising and falling transitions of the input signal, then it may not be necessary for the other transition to be optimised. A single level shifting circuitry designed to react quickly to the preferred transition may therefore be enough.

However, often a level shifter may be provided in two parts, each part having a pulldown path and a pullup path, and each part processing signals of opposite plurality to the other half. This is because typically each part of the level shifter can respond more quickly to one of the rising and falling transitions of the input signal than the other transition, and so by providing complementary level shifting portions which process signals of opposite polarity, each portion can respond more quickly to a different one of the rising and falling transitions of the input signal. The output signal may then be based on the one of the portions that responds most quickly to each transition, so that the level shifter as a whole can operate at a greater speed.

Similarly, the level shifter of the present technique may be provided with first and second level shifting circuitry of the type discussed above. Each of the first and second level shifting circuitry may have a pulldown path, a pullup path, pullup control circuitry and a keeper path as discussed above. The first and second level shifting circuitry process signals of opposite polarities so that when one of the first and second level shifting circuitry is pulling its output signal up to the higher output voltage level, the other is pulling its output signal down to the lower output voltage level. In both parts of the level shifter, the provision of the keeper path together with the pullup control circuitry for rendering the pullup path non-conductive enables each part of the level shifter to operate with a lower input signal voltage level.

The first and second level shifting circuitry may be cross-coupled with the pullup path of the first level shifting circuitry configured to pull the output signal of the first level shifting circuitry to the higher output voltage level in response to a transition of the output signal of the second level shifting circuitry, and vice versa.

The output signal of one level shifting circuitry may also be used to control placing the pullup path of the other level shifting circuitry into the non-conductive state. This can be useful for regulating the timings at which the pullup path is rendered non-conductive, so that there is a slight delay between the output signal of one of the first and second level shifting circuitry being pulled to the higher output voltage level and the pullup path of that level shifting circuitry being rendered non-conductive by the control circuitry in response to the output signal from the other level shifting circuitry. This delay can be useful for ensuring that the output signal fully reaches the higher output voltage level before the pullup path becomes non-conductive.

The level shifting circuitry and level shifter described above may be part of a circuit for transferring signals between different integrated circuits or between different portions of an integrated circuit. The different integrated circuits or portions of an integrated circuit may operate in different voltage domains, and so it can be useful to provide the input/output circuitry bridging the domains with a level shifter for converting between the signal levels used in the different voltage domains.

Viewed from another aspect, the present invention provides level shifting circuitry for generating an output signal in response to an input signal, said input signal having one of a lower input voltage level and a higher input voltage level, and said output signal having one of a lower output voltage level and a higher output voltage level; said level shifting circuitry comprising:

pulldown path means for pulling said output signal to said lower output voltage level in response to a first transition of said input signal, said first transition comprising one of a rising transition from said lower input voltage level to said higher input voltage level and a falling transition from said higher input voltage level to said lower input voltage level; pullup path means for pulling said output signal to said higher output voltage level in response to a second transition of said input signal, said second transition comprising the other of said rising transition and said falling transition of said input signal;

pullup control means for placing said pullup path means in a non-conductive state in response to said pullup path means pulling said output signal to said higher output voltage level; and keeper path means for keeping said output signal at said higher output voltage level while said pullup path means is in said non-conductive state until said pulldown path means pulls said output signal to said lower output voltage level;

wherein a maximum drive current of said pulldown path means is greater than a maximum drive current of said keeper path means.

Viewed from a further aspect, the present invention provides a level shifting method for generating an output signal in response to an input signal, said input signal having one of a lower input voltage level and a higher input voltage level, and said output signal having one of a lower output voltage level and a higher output voltage level; said method comprising:

controlling a pulldown path to pull said output signal to said lower output voltage level in response to a first transition of said input signal, said first transition comprising one of a rising transition from said lower input voltage level to said higher input voltage level and a falling transition from said higher input voltage level to said lower input voltage level;

controlling a pullup path to pull said output signal to said higher output voltage level in response to a second transition of said input signal, said second transition comprising the other of said rising transition and said falling transition of said input signal;

placing said pullup path in a non-conductive state in response to said pullup path pulling said output signal to said higher output voltage level; and controlling a keeper path to keep said output signal at said higher output voltage level while said pullup path is in said non-conductive state until said pulldown path pulls said output signal to said lower output voltage level;

wherein a maximum drive current of said pulldown path is greater than a maximum drive current of said keeper path.

Further particular and preferred aspects of the present invention are set out in the accompanying independent and dependent claims. Features of the dependent claims may be combined with features of the independent claims as appropriate, and in combinations other than those explicitly set out in the claims.

DESCRIPTION OF EMBODIMENTS

Figure 2:
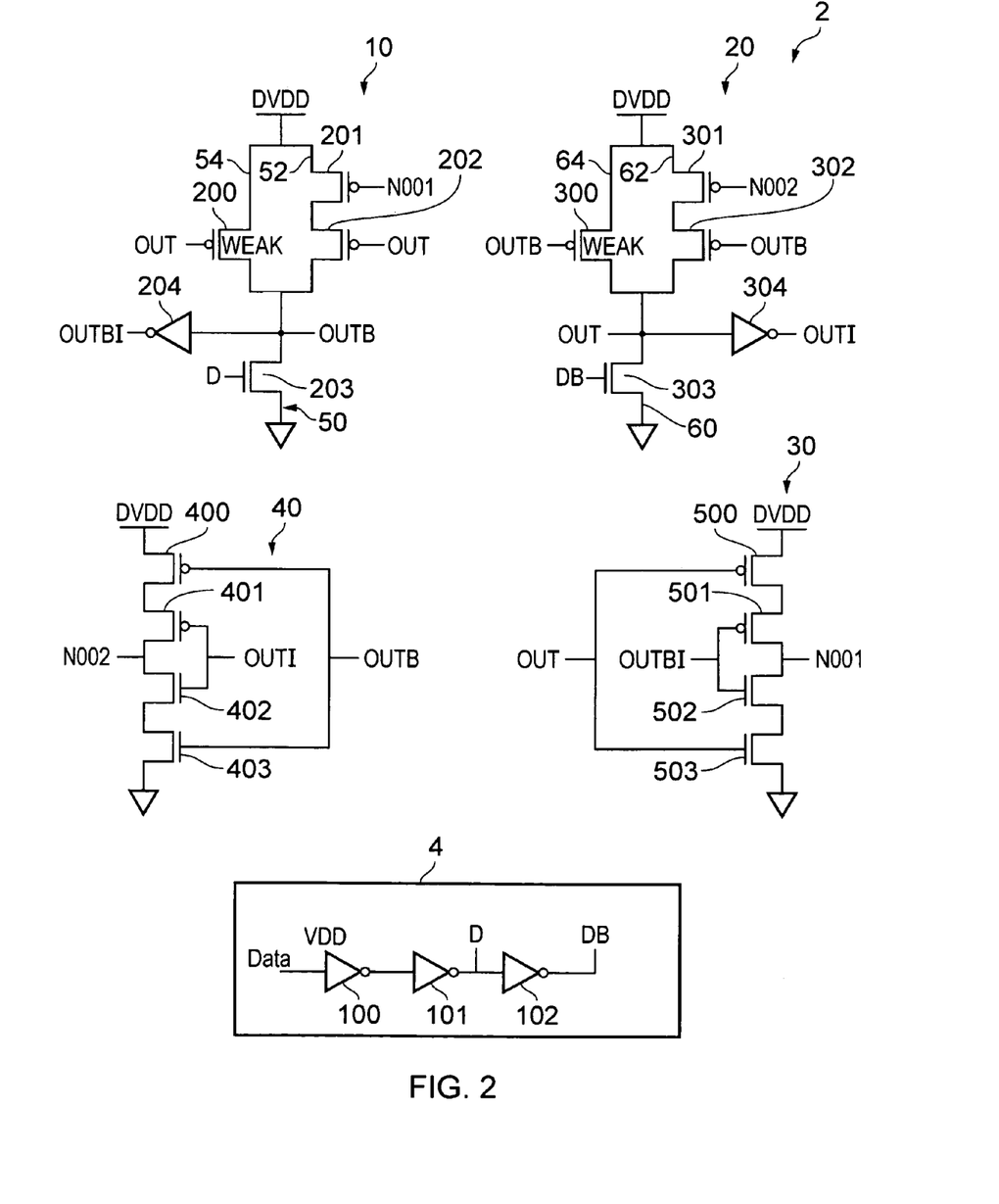
FIG. 2 shows a level shifter comprising first and second level shifting circuitry each having a pulldown path, a pullup path, pullup control circuitry and a keeper path.

FIG. 2 shows a level shifter 2 for generating an output signal in response to an input signal. The input signal Data switches between a lower input voltage level (ground) and a higher input voltage level (VDD), while the output signal OUT, OUTB switches between a lower output voltage level (ground) and a higher output voltage level (DVDD). In this example, the higher output voltage level DVDD is higher than the higher input voltage level VDD, although the level shifter could also be used for a transition from a higher voltage domain to a lower voltage domain.

The level shifter 2 comprises an input signal inverting section 4 which operates in the input voltage domain (VDD domain). The input signal inverting section 4 comprises inverters 100, 101, 102 which generate complementary input signals D, DB based on the input signal Data. The input signal D is a non-inverted version of the input signal Data, and the input signal DB is an inverted version of the input signal Data.

The level shifter 2 also includes first level shifting circuitry 10, second level shifting circuitry 20, first control circuitry 30 and second control circuitry 40. These elements of the level shifter 2 all operate in the output voltage domain (DVDD domain). The first level shifting circuitry 10 and second level shifting circuitry 20 generate complementary output signals OUTB, OUT in response to the complementary input signals D, DB respectively. Either of the output signals OUTB, OUT may be taken as the output signal of the level shifting circuitry, depending on whether or not it is desired to produce an output signal that is inverted relative to the input signal Data.

The first level shifting circuitry 10 comprises a pulldown path 50 coupling the output node OUTB to the ground supply rail, a pullup path 52 coupling the output node OUTB to the DVDD supply rail, and a keeper path 54 arranged in parallel with the pullup path 52 so that it also couples the DVDD power rail to the output node OUTB. An inverter 204 is provided to invert the output signal at node OUTB to generate an inverted signal OUTBI.

The pulldown path 50 of the first level shifting circuitry 10 includes an n-type pulldown transistor 203, and the non-inverted input signal D is applied to the gate of the pulldown transistor 203. In response to a rising edge transition of the input signal D, the pulldown transistor 203 pulls the output node OUTB down to the ground voltage level.

The pullup path 52 of the first level shifting circuitry 10 comprises an isolating transistor 201 and a pullup transistor 202 arranged in series between the output node OUTB and the DVDD supply rail. The isolating transistor 201 and pullup transistor 202 are cascoded devices. The keeper path 54 comprises a keeper transistor 200. The keeper transistor 200 is a weaker transistor (having lower drive strength) than the other transistors of the first level shifting circuitry 10, and so the keeper transistor 200 cannot pass as large a current as the pulldown transistor 203. The keeper transistor 200 and the pullup transistor 202 are p-type transistors whose gates are connected to the output node OUT of the second level shifting circuitry 20. In response to a falling edge of the output signal OUT of the second level shifting circuitry 20, the pullup transistor 202 and keeper transistor 200 are turned on to pull the output signal OUTB of the first level shifting circuitry 20 to the DVDD voltage level.

On the other hand, the isolating transistor 201 is p-type transistor which receives at its gate a control signal N001 from the first control circuitry 30. The first control circuitry 30 comprises two p-type pullup transistors 500, 501 and two n-type pulldown transistors 502, 503 arranged in series between the DVDD power rail and ground. Transistors 500, 503 of the first control circuitry 30 receive at their gates the output signal OUT of the second level shifting circuitry 20 while transistors 501, 502 receive at their gate the inverted output signal OUTBI received from the first level shifting circuitry 10. Isolating transistor 201 is turned on when control signal N001 is low, which occurs when the output signal OUT of the second level shifting circuitry 20 and the inverted output signal OUTBI of the first level shifting circuitry 10 are both high. At other times, control signal N001 is high and so isolating transistor is turned off to render pullup path 52 non-conductive.

Since signals OUT, OUTBI are both high during the period when output signal OUTB of the first level shifting circuitry 10 is low, isolating transistor 201 is switched on to render pullup path 52 conductive before it needs to pull the output signal OUTB up to DVDD in response to the next transition of input signal Data. On the other hand, signals OUT, OUTBI are both low during the period when output signal OUTB of the first level shifting circuitry 10 is high, and so at this time control signal N001 will be high and will turn off isolating transistor 201. This places pullup path 52 in a non-conductive state to allow the pulldown path 50 to easily overcome the weaker keeper path 54 and pull OUTB down to ground in response to the next transition of input signal Data.

The second level shifting circuitry 20 is arranged in an analogous way to the first level shifting circuitry with a pulldown path 60, a pullup path 62 and keeper path 64 each mirroring the corresponding paths of the first level shifting circuitry 10. Similarly, the second control circuitry 40 generates a second control signal N002 for controlling the isolating transistor 301 of the second level shifting circuitry 20 in a similar way to the first control circuitry 30. The first and second level shifting circuitry 10 and 20 are cross-coupled with the gate of the pullup transistor 202, 302 and keeper transistor 200, 300 of one level shifting circuitry 10, 20 coupled to the output signal OUT, OUTB of the other circuit (for clarity, the connections between the output node of one circuit and the gate inputs in the other circuit are not shown in FIG. 2).

While FIG. 2 shows an example in which the pulldown and keeper paths of the level shifter 2 comprise only a single transistor and the pullup path two transistors, it will be appreciated that other level shifter designs may provide paths with more complicated arrangements of transistors.

FIGS. 3 to 9 illustrate an example of the operation of the level shifter 2 of FIG. 2. FIGS. 3 to 9 each show the state of the level shifter 2 at a different stage of the level shifter's cycle of operation as the input signal Data switches from low to high and back again.

Figure 3:
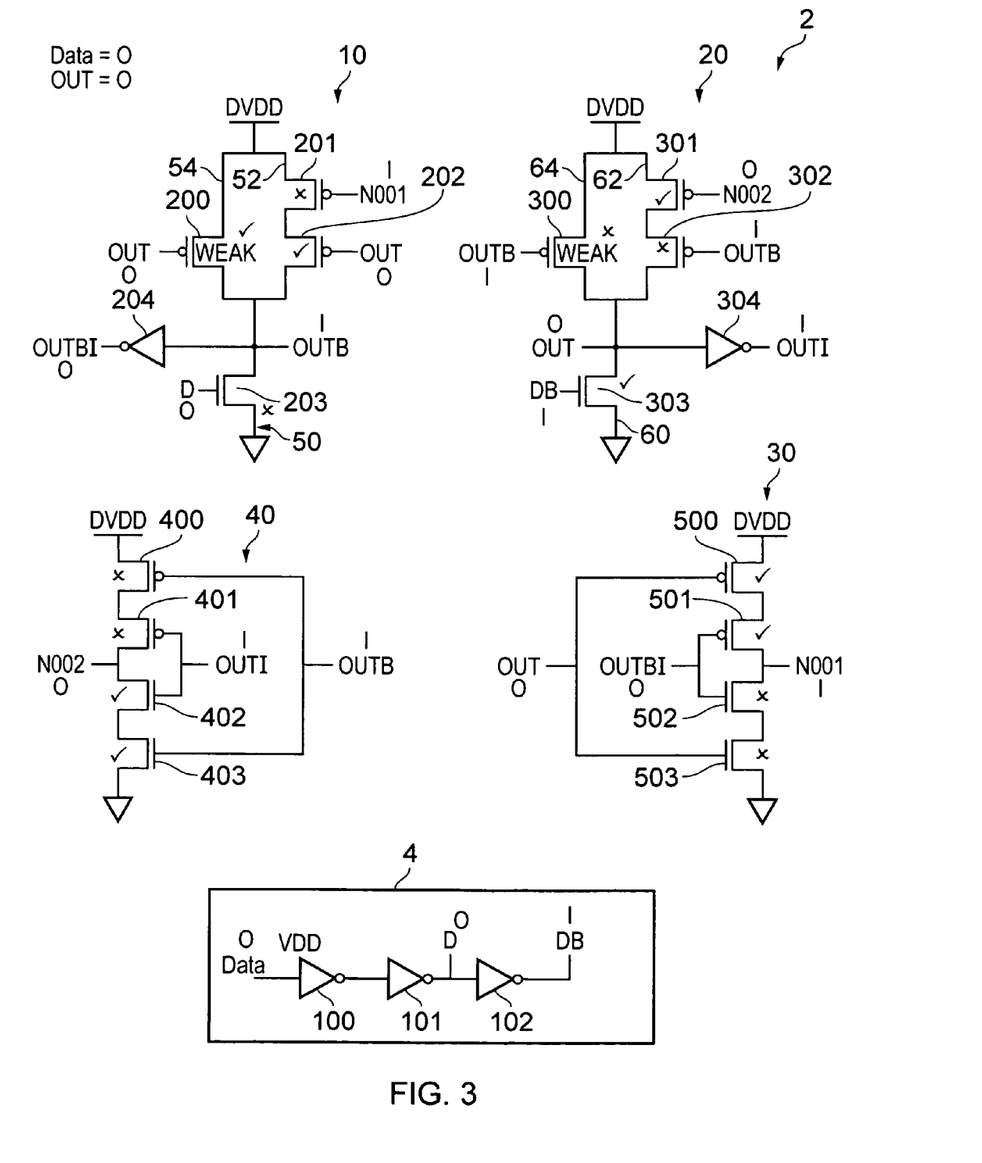
FIGS. 3 to 9 show the state of the level shifter of FIG. 2 at different stages of operation.

In FIG. 3, the level shifter 2 is in an initial state where the input signal Data is low, so that the complementary signals D and DB are low and high respectively. This means that the output signal OUT of the second level shifting circuitry 20 is also low and the complementary output signal OUTB of the first level shifting circuitry 10 is high. Transistors 200, 202, 301, 303, 402, 403, 500 and 501 are on at this time and transistors 201, 203, 300, 302, 400, 401, 502 and 503 are off.

Figure 4:
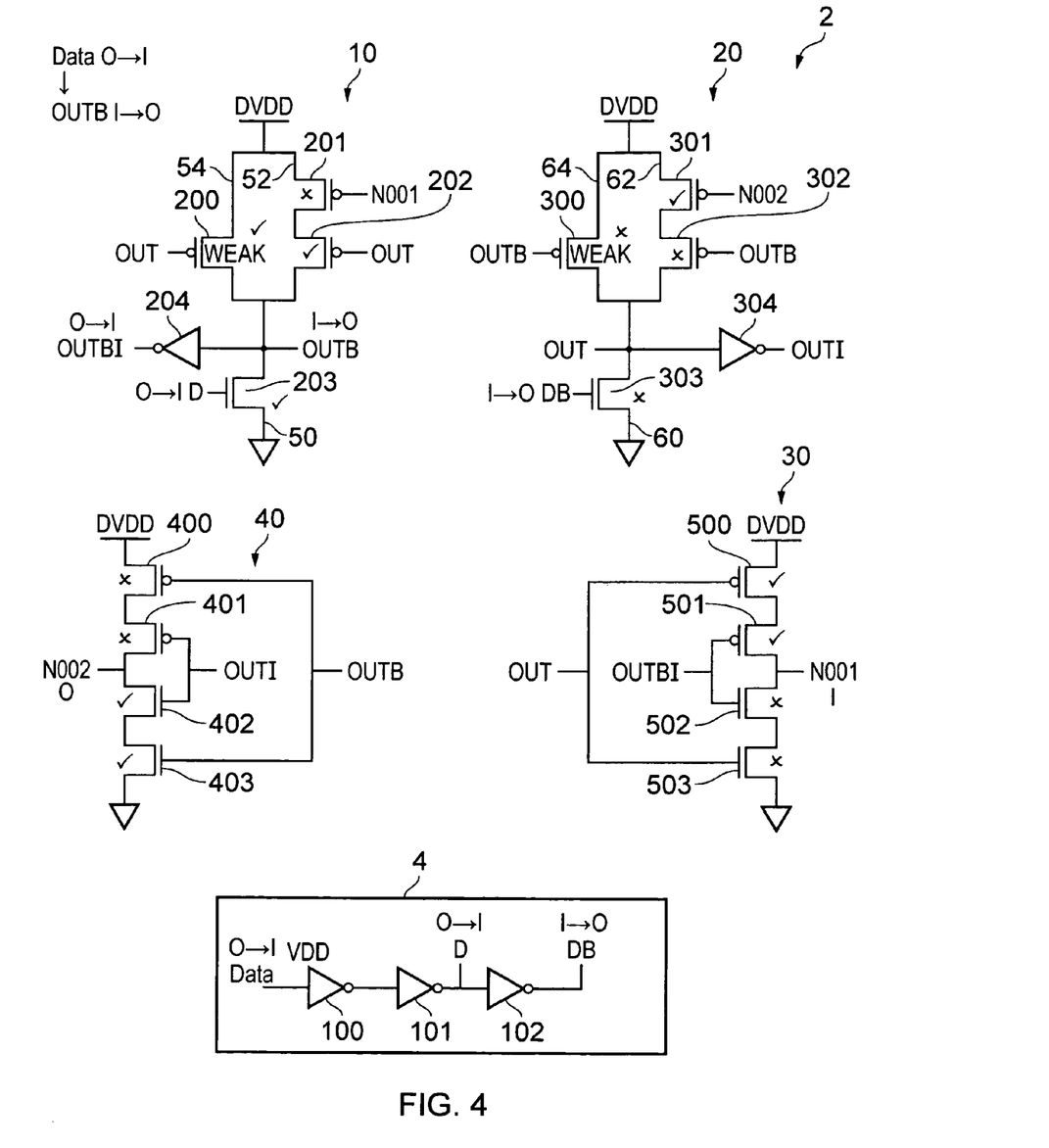

As shown in FIG. 4, when the input signal Data transitions from low to high, then the signal D rises high and the inverted signal DB falls low. The rising edge of signal D turns on the pulldown transistor 203 of the first level shifting circuitry 10 and the falling edge of signal DB turns off the pulldown transistor 303 of the second level shifting circuitry 20. At this time, the isolating transistor 201 of the first level shifting circuitry 10 is off and so the pulldown transistor 203 is only in competition with the weaker keeper transistor 200, not the pullup path 52. As the pulldown transistor 203 can pass a greater amount of current than the keeper transistor 200, the pulldown transistor 203 easily overcomes keeper transistor 200 so that the output signal OUTB of the first level shifting circuitry 10 transitions low and the inverted output node OUTBI transitions high.

Figure 5:
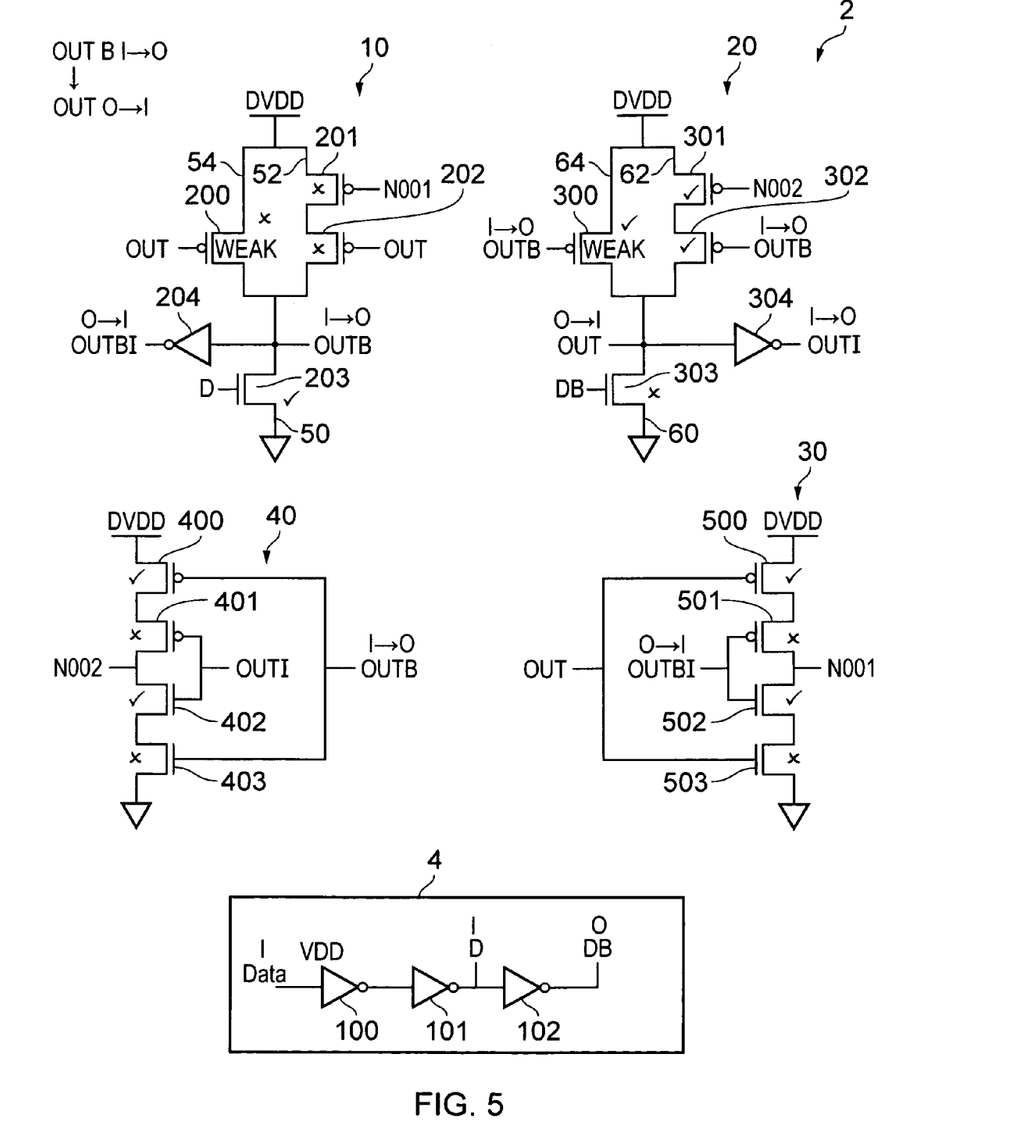

As shown in FIG. 5, the transition of the output node OUTB of the first level shifting circuitry 10 from high to low causes the pullup transistor 302 and keeper transistor 300 of the second level shifting circuitry 20 to turn on. Since the isolating transistor 301 of the second level shifting circuitry 20 is already on, the pullup path 62 of the second level shifting circuitry 20 is now conductive, and so the pullup path 62 and keeper path 64 together pull the output node OUT high. Accordingly, the inverted output node OUTI transitions low.

Also, the transition of the output node OUTB of the first level shifting circuitry 10 to the low signal value turns on transistor 400 and turns off transistor 403 in the second control circuitry 40. Similarly, the transition of the inverted output OUTBI of the first level shifting circuitry 10 to a high value turns off transistor 501 and turns on transistor 502 in the first control circuitry 30.

Figure 6:
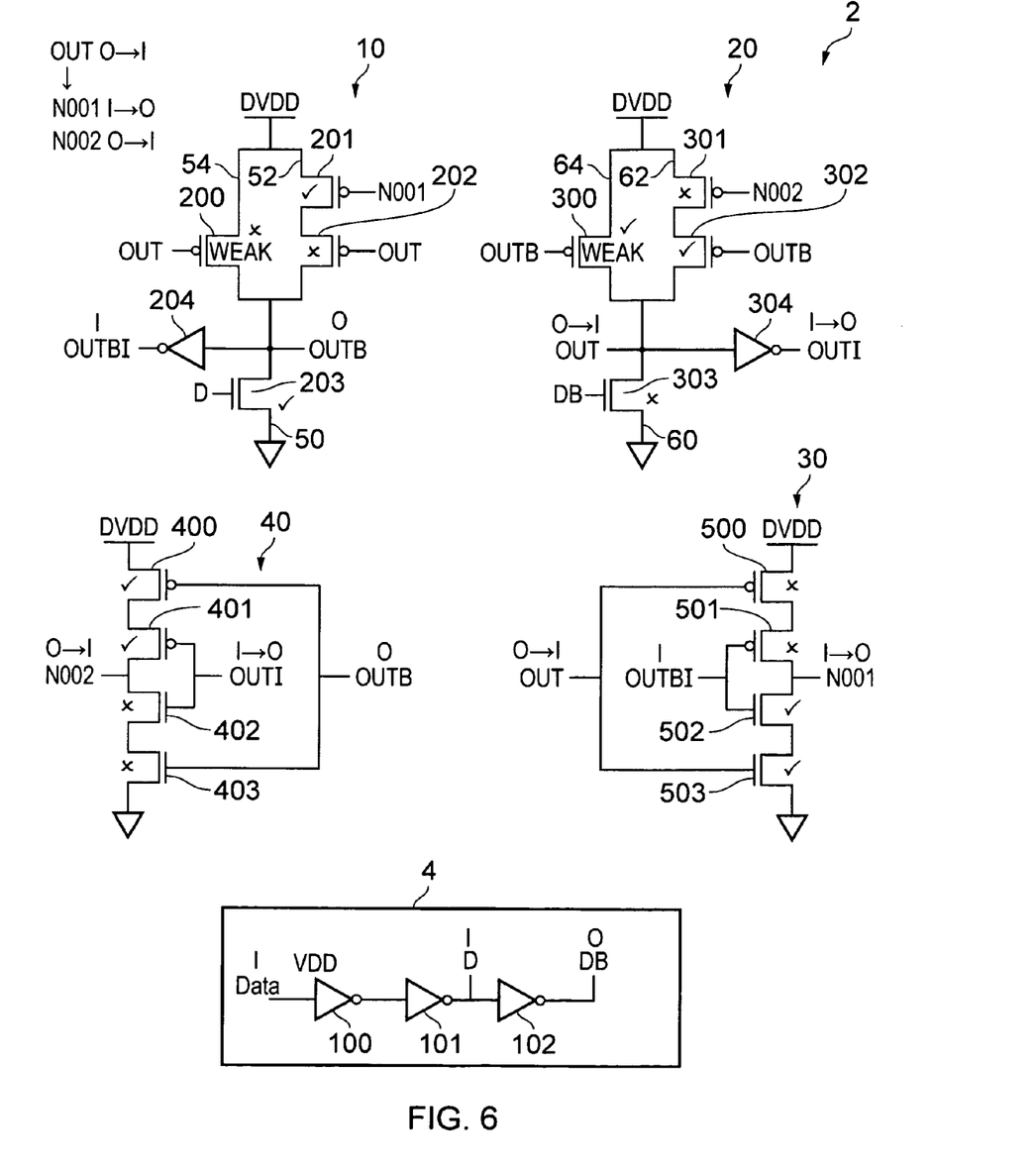

As shown in FIG. 6, in response to the rising transition of the output node OUT of the second level shifting circuitry 20, the pull up transistor 500 of the first control circuitry 30 is turned off and the pull down transistor 503 of the first level control circuitry 30 is turned on. This causes the first control signal N001 to transition low, which turns on the isolating transistor 201 of the first level shifting circuitry 10. This prepares the first level shifting circuitry 10 for the upcoming transition of the input signal Data, because the pullup path 202 is now conductive ready to pull the output node OUTB up to DVDD.

Conversely, FIG. 6 shows that in response to the transition of the inverted output signal OUTI of the second level shifting circuitry 20 from high to low, pullup transistor 401 of the second control circuitry 40 is turned on and pulldown transistor 402 is turned off. This causes control signal N002 to rise to a high value, turning off the isolating transistor 301 in the second level shifting circuitry 20. This prepares the second level shifting circuitry 20 for the next input signal transition, since the pullup path 20 is now non-conductive so that it will not compete with the pullup path 60.

Figure 7:
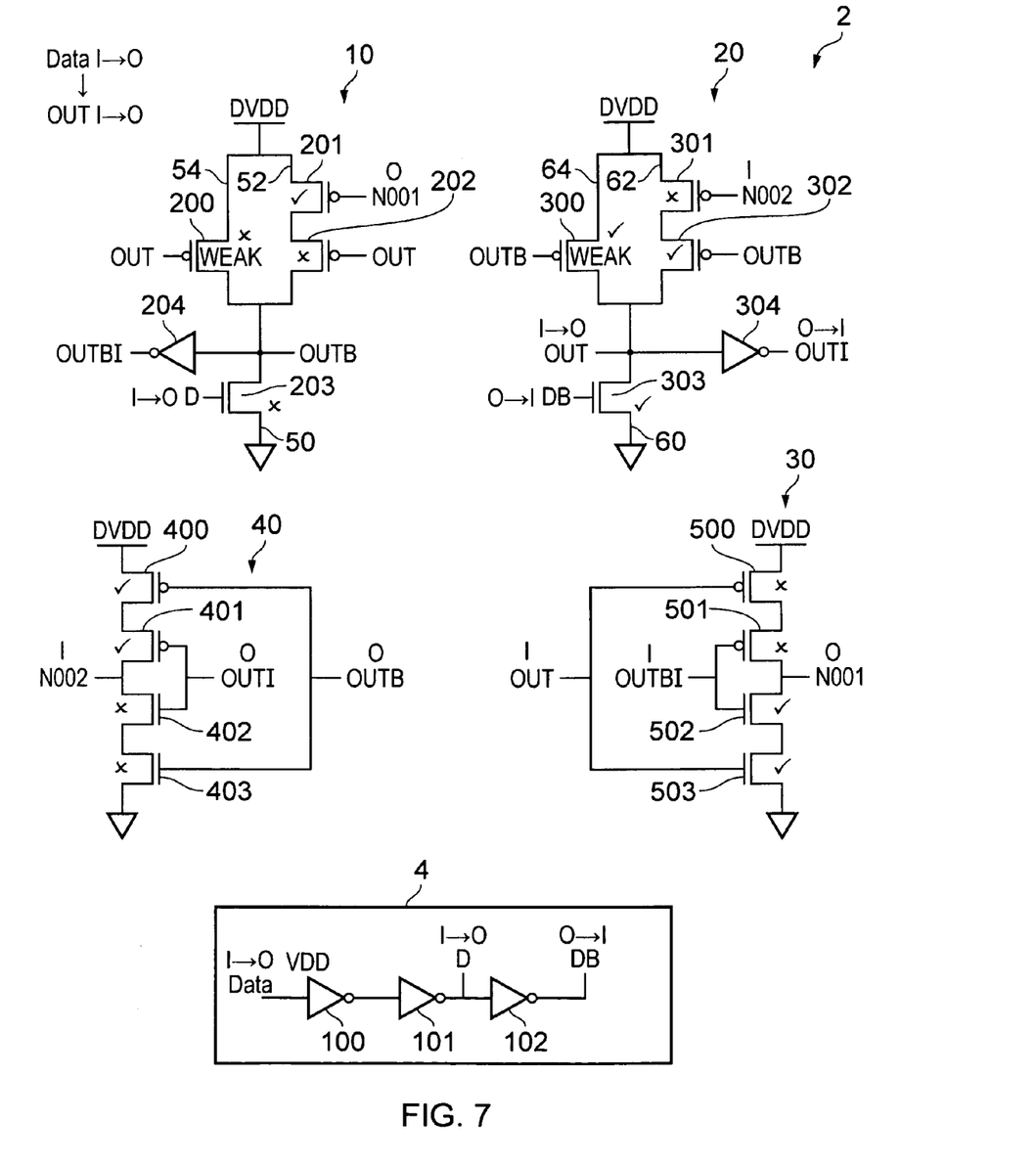

As shown in FIG. 7, when the input signal Data transitions from high to low, then the signals D, DB transition from high to low and low to high respectively. The falling transition in signal D turns off pulldown transistor 203 of the first level shifting circuitry 10. The rising transition of signal DB turns on pulldown transistor 303 of the second level shifting circuitry 20. Since the pullup path 62 has already been made non-conductive by switching off isolating transistor 301, then the pulldown path 60 easily overcomes the weak keeper path 64 to pull output node OUT down to ground. This causes the inverted output node OUTI to rise to DVDD.

Figure 8:
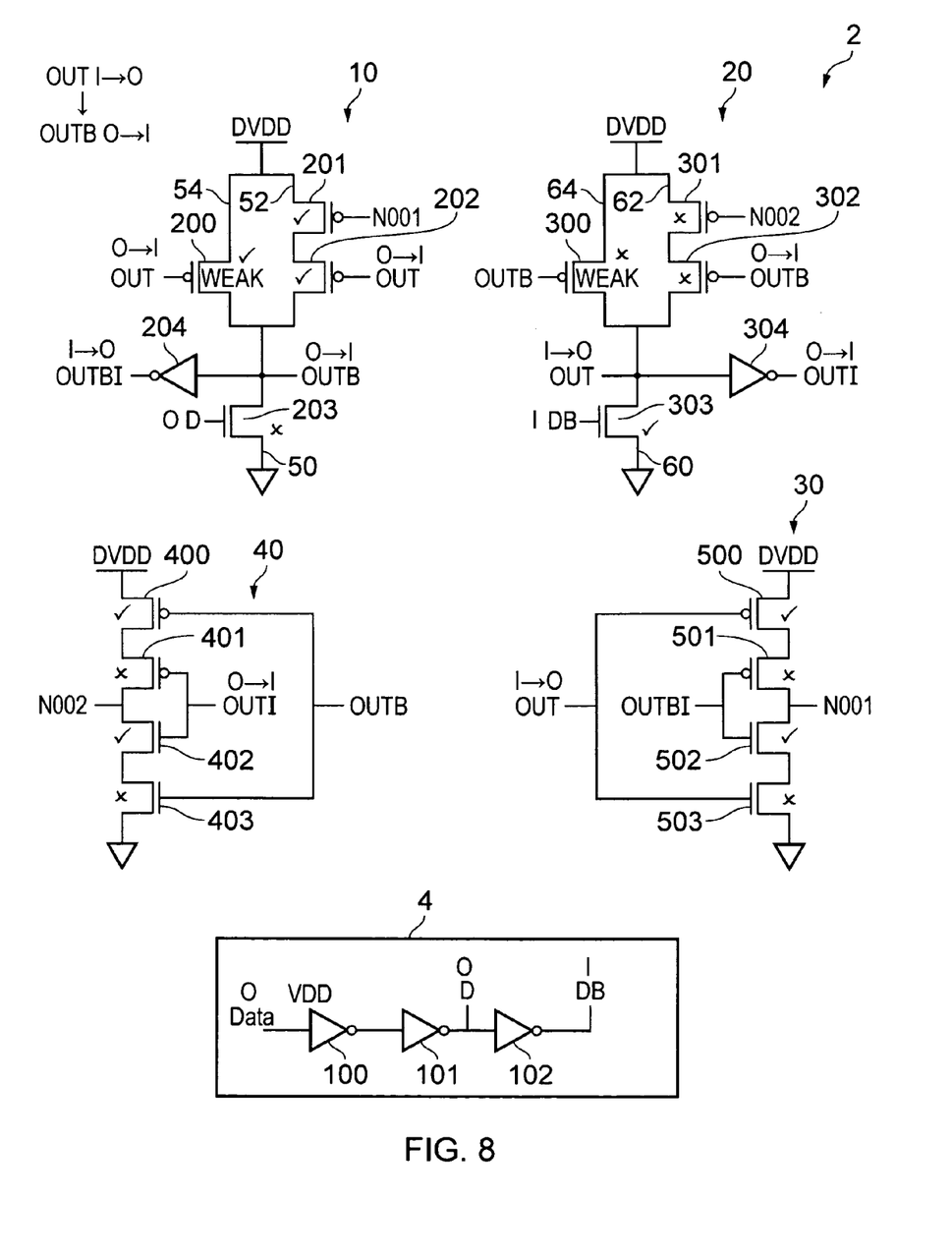

As shown in FIG. 8, the transition of the output node OUT to ground turns on keeper transistor 200 and pullup transistor 202 of the first level shifting circuitry 10. Since the isolating transistor 201 is conductive, the pullup path 52 is also conductive and so the pullup path 52 and keeper path 54 together pull output node OUTB high, causing inverted output node OUTBI to drop low.

Also, FIG. 8 shows that the falling transition of the output signal OUT of the second level shifting circuitry 20 causes transistor 500 of the first control circuitry 20 to turn on and transistor 503 to turn off. Similarly, the rising transition of the inverted output node OUTI of the second level shifting circuitry 20 causes transistor 401 of the second control circuitry 40 to turn off and transistor 402 to turn on.

Figure 9:
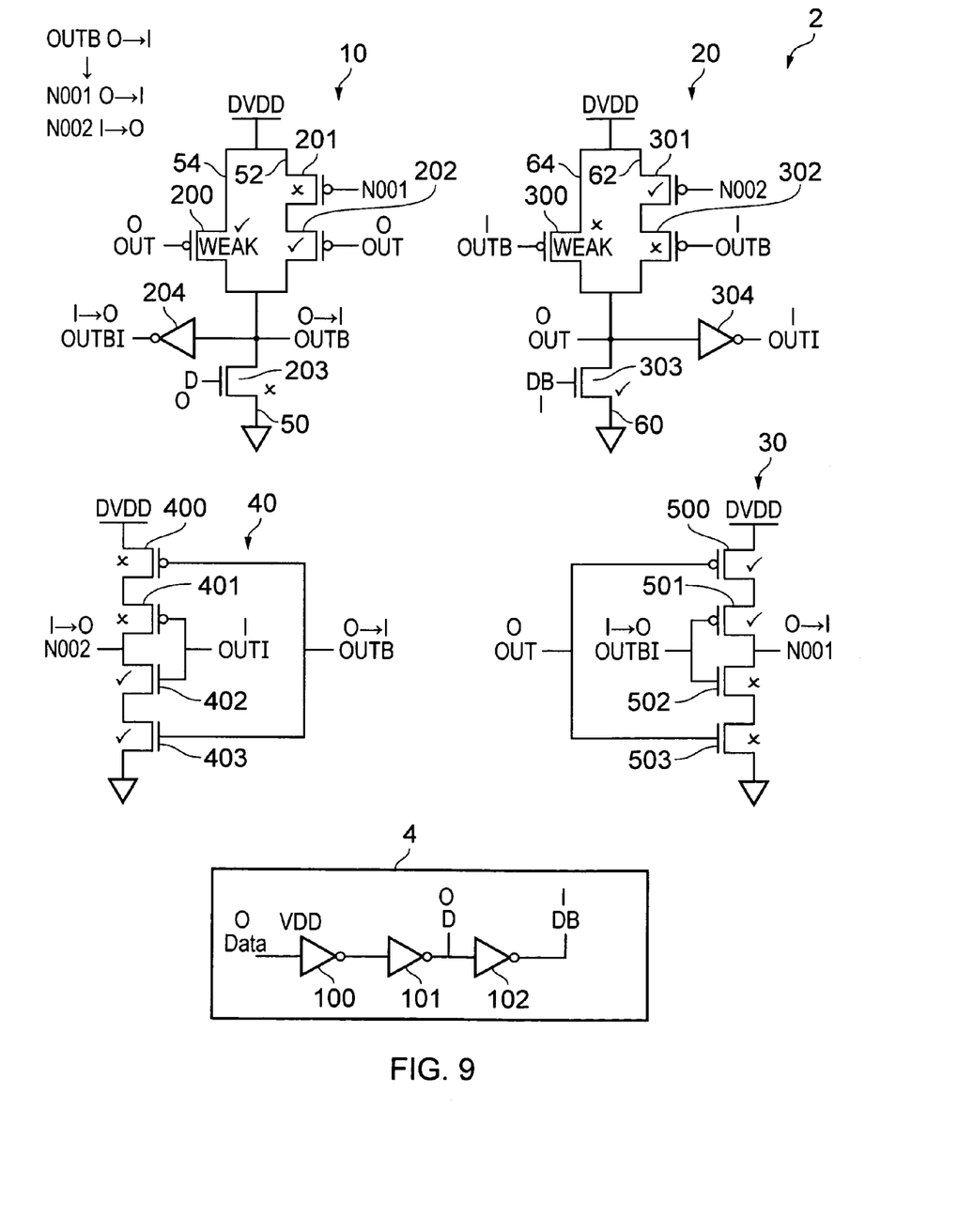

As shown in FIG. 9, the transition of the output node OUTB of the first level shifting circuitry 10 from low to high turns on transistor 403 and turns off transistor 400 of the second control circuitry 40. This causes control signal N002 to be pulled low, which turns on the isolating transistor 301 in the second level shifting circuitry 20. This prepares the pullup path 62 for the next transition of the input signal, when the pullup path 62 will be made conductive again when pullup transistor 302 is turned on. Similarly, the transition of the inverted output signal OUTBI of the first level shifting circuitry 10 causes transistor 501 of the first control circuitry 30 to turn on and transistor 502 to turn off. This causes control signal N001 to rise high, turning off isolating transistor 201 of the first level shifting circuitry 10. The pull up path 52 is now in the non-conductive state and so at the next transition of the input signal, the pulldown path 50 can easily overcome the weak keeper path 54. The level shifter 2 in FIG. 9 is now in the same state as shown in FIG. 3 and so as operation the level shifter continues, the level shifter 2 will cycle through the states shown in FIGS. 3 to 9.

As shown in FIGS. 3 to 9, the control circuitry 30, 40 for each half of the level shifter 2 includes a pair of pullup transistors (400, 401 for first control circuitry 30 and 500, 501 for second control circuitry 40) and a pair of pulldown transistors (402, 403 for first control circuitry 30 and 502, 503 for second control circuitry 40). Each pair of transistors is controlled such that one of the pair of transistors switches in response to a transition of the output signal or inverted output signal of one of the first and second level shifting circuitry 10, and the other of the pair of transistors switches in response to the output signal or inverted output signal of the other of the first and second level shifting circuitry 10, 20. This is useful because it prevents glitches in the control signals N001, N002 during the very short periods when one of the level shifting circuitries 10, 20 has switched its output in response to an edge of the input signal, but the other has not yet switched.

While FIGS. 2 to 9 show an example in which, for the output signal OUTB of the first level shifting circuitry 10, the pulldown transition to ground occurs in response to a rising transition of the input signal Data and the pullup transition to DVDD occurs in response to a falling edge of the input signal Data, while for the output signal OUT of the second level shifting circuitry 20, the pullup transition to DVDD occurs in response to a rising edge of the input signal Data and the pulldown transition to ground occurs in response to the falling edge, it will be appreciated that this could also be the other way round. It does not matter which transition of the input signal causes the transition of the output signal from low to high or high to low.

Figure 10:
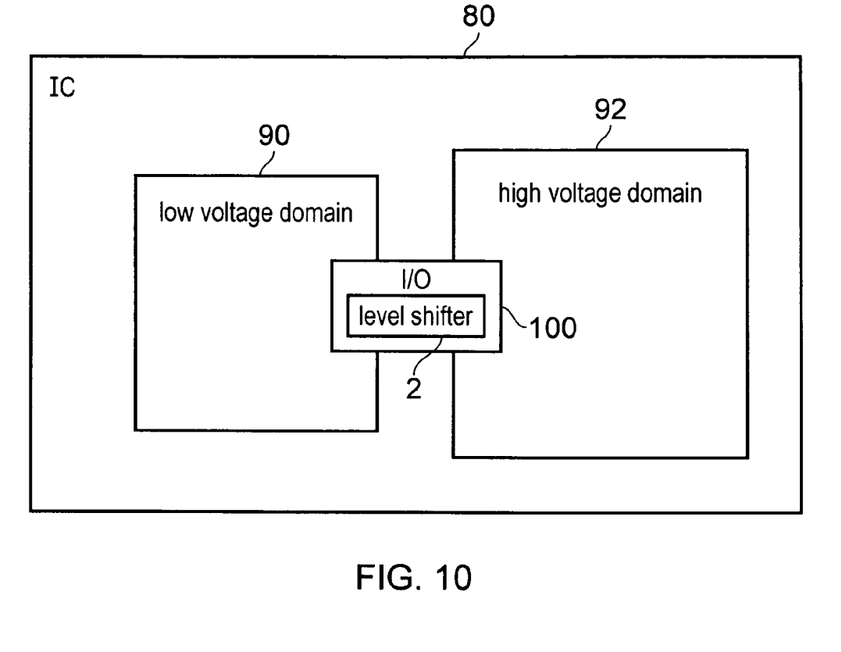
FIG. 10 shows an integrated circuit having a low voltage domain and a high voltage domain and an input/output circuit for passing signals between the voltage domains.

FIG. 10 shows an integrated circuit 80 comprising a low voltage domain 90 and a high voltage domain 92. For example, the low voltage domain 90 may be connected to the VDD rail and the high voltage domain 92 connected to the DVDD rail as shown in FIGS. 2 to 9. Input/output circuitry 100 is provided to transfer signals between the low voltage domain 90 and high voltage domain 92. The input/output circuitry 100 includes the level shifter 2 as shown in FIGS. 2 to 9. Although FIG. 10 shows an example where the input/output circuitry 100 inputs and outputs signals between different portions of the same integrated circuit 80, the input/output circuitry 100 may also be used to communicate between different integrated circuits.

Figure 11:
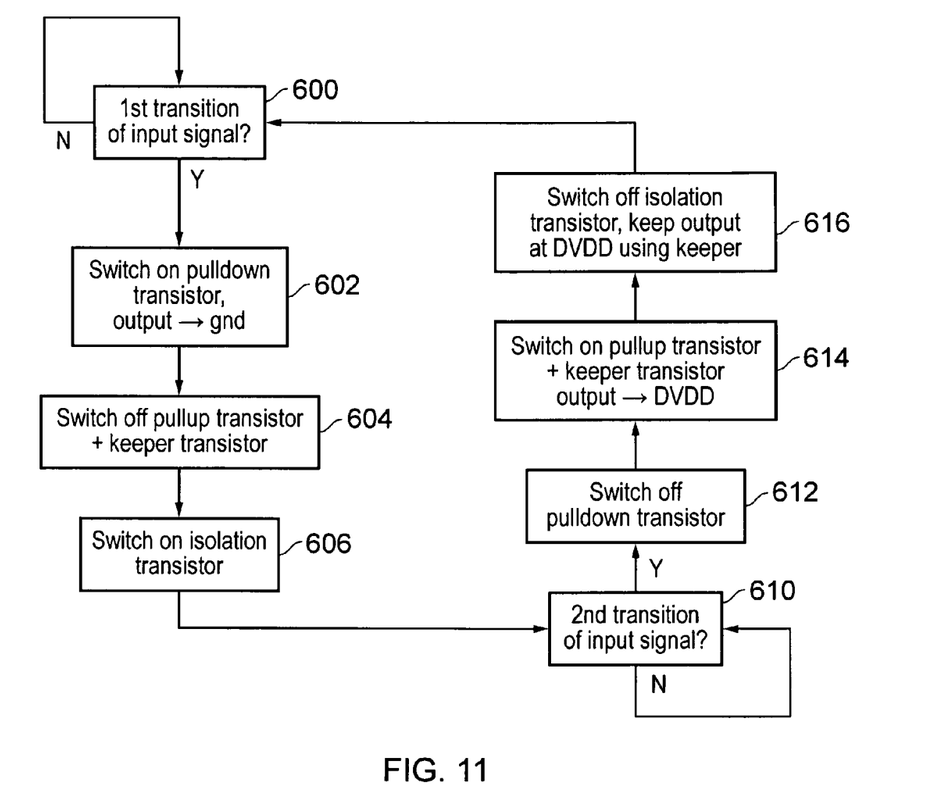
FIG. 11 shows a level shifting method.

FIG. 11 shows a level shifting method of generating an output signal in response to an input signal. At step 600, the method waits for a first transition of the input signal to occur. The first transition may be either the rising transition of the input signal from low to high or the falling transition of the input signal from high to low. When the first transition occurs, then at step 602 the first level shifting circuit 10 switches on the pulldown transistor 203, causing the output signal OUTB to be pulled to ground. At step 604 the first level shifting circuitry 10 switches off the pullup transistor 202 and keeper transistor 200. At step 606, the level shifting circuitry 10 switches on the isolation transistor 201 in response to the control signal N001 from the first control circuitry 30.

When the other transition of the input signal occurs at step 610, then the first level shifting circuitry 10 switches off the pulldown transistor 203 at step 612. At step 614 the pullup transistor and keeper transistor are turned on, so that the output signal is pulled to DVDD. Then at step 616, the isolation transistor 201 is turned off, but the keeper transistor 200 remains on to keep the output at DVDD. Since the isolation transistor is now off, then when the first transition of the input signal occurs again at step 600, then at step 602 the pulldown transistor 203 can easily overcome the weak competition of the keeper transistor 200 without needing to compete with the pullup transistor 202.

Meanwhile, the second level shifting circuitry 20 of the level shifter 2 would also perform the method of FIG. 11. However, while the first level shifting circuitry 10 responds to the first transition of the input signal at step 600, the second level shifting circuitry 20 responds to the second transition of the input signal at step 610, and vice versa. Hence, the first and second level shifting circuitry 10, 20 are anti-symmetric with the signals of the second level shifting circuitry 20 and second control circuitry 40 having the opposite polarity to the signals processed by the first level shifting circuitry 10 and first control circuitry 30.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Level shifting circuitry for generating an output signal in response to an input signal, said input signal having one of a lower input voltage level and a higher input voltage level, and said output signal having one of a lower output voltage level and a higher output voltage level; said level shifting circuitry comprising:
   a pulldown path configured to pull said output signal to said lower output voltage level in response to a first transition of said input signal, said first transition comprising one of a rising transition from said lower input voltage level to said higher input voltage level and a falling transition from said higher input voltage level to said lower input voltage level;
a pullup path configured to pull said output signal to said higher output voltage level in response to a second transition of said input signal, said second transition comprising the other of said rising transition and said falling transition of said input signal;
pullup control circuitry configured to place said pullup path in a non-conductive state in response to said pullup path pulling said output signal to said higher output voltage level; and
a keeper path configured to keep said output signal at said higher output voltage level while said pullup path is in said non-conductive state until said pulldown path pulls said output signal to said lower output voltage level;
wherein a maximum drive current of said pulldown path is greater than a maximum drive current of said keeper path.

2. The level shifting circuitry according to claim 1, wherein said pullup control circuitry is configured to control placing said pullup path in said non-conductive state in dependence on said output signal.

3. The level shifting circuitry according to claim 1, wherein said pullup path comprises a pullup transistor and an isolating transistor arranged in series between an output node for outputting said output signal and a supply rail for supplying said higher output voltage level.

4. The level shifting circuitry according to claim 3, wherein said pullup transistor is configured to switch to a conductive state in response to said second transition of said input signal, and to switch to a non-conductive state in response to said first transition of said input signal.

5. The level shifting circuitry according to claim 3, wherein said pullup control circuitry is configured to switch said isolating transistor to a non-conductive state in response to said pullup path pulling said output signal to said higher output voltage level, and to switch said isolating transistor to a conductive state in response to said pulldown path pulling said output signal to said lower output voltage level.

6. The level shifting circuitry according to claim 1, wherein a maximum drive current of said pullup path is greater than said maximum drive current of said keeper path.

7. The level shifting circuitry according to claim 1, wherein said higher output voltage level is greater than said higher input voltage level.

8. The level shifting circuitry according to claim 1, wherein a difference between said higher output voltage level and said lower output voltage level is greater than a difference between said higher input voltage level and said lower input voltage level.

9. A level shifter comprising:
first level shifting circuitry and second level shifting circuitry according to claim 1;
wherein said input signal of said first level shifting circuitry and said input signal of said second level shifting circuitry are complementary signals of opposite polarity; and
said output signal of said first level shifting circuitry and said output signal of said second level shifting circuitry are complementary signals of opposite polarity.

10. The level shifter according to claim 9, wherein said first level shifting circuitry and said second level shifting circuitry are cross-coupled with said pullup path of said first level shifting circuitry configured to pull said output signal of said first level shifting circuitry to said higher output voltage level in response to a transition of said output signal of said second level shifting circuitry, and said pullup path of said second level shifting circuitry configured to pull said output signal of said second level shifting circuitry to said higher output voltage level in response to a transition of said output signal of said first level shifting circuitry.

11. The level shifter according to claim 9, wherein said pullup control circuitry of said first level shifting circuitry is configured to place said pullup path of said first level shifting circuitry in said non-conductive state when said output signal of said first level shifting circuitry has said higher output voltage level and said output signal of said second level shifting circuitry has said lower output voltage level; and
said pullup control circuitry of said second level shifting circuitry is configured to place said pullup path of said second level shifting circuitry in said non-conductive state when said output signal of said second level shifting circuitry has said higher output voltage level and said output signal of said first level shifting circuitry has said lower output voltage level.

12. A circuit for transferring signals between different integrated circuits or different portions of an integrated circuit, comprising the level shifting circuitry according to claim 1.

13. A circuit for transferring signals between different integrated circuits or different portions of an integrated circuit, comprising the level shifter according to claim 9.

14. Level shifting circuitry for generating an output signal in response to an input signal, said input signal having one of a lower input voltage level and a higher input voltage level, and said output signal having one of a lower output voltage level and a higher output voltage level; said level shifting circuitry comprising:
pulldown path means for pulling said output signal to said lower output voltage level in response to a first transition of said input signal, said first transition comprising one of a rising transition from said lower input voltage level to said higher input voltage level and a falling transition from said higher input voltage level to said lower input voltage level;
pullup path means for pulling said output signal to said higher output voltage level in response to a second transition of said input signal, said second transition comprising the other of said rising transition and said falling transition of said input signal;
pullup control means for placing said pullup path means in a non-conductive state in response to said pullup path means pulling said output signal to said higher output voltage level; and
keeper path means for keeping said output signal at said higher output voltage level while said pullup path means is in said non-conductive state until said pulldown path means pulls said output signal to said lower output voltage level;
wherein a maximum drive current of said pulldown path means is greater than a maximum drive current of said keeper path means.

15. A level shifting method for generating an output signal in response to an input signal, said input signal having one of a lower input voltage level and a higher input voltage level, and said output signal having one of a lower output voltage level and a higher output voltage level; said method comprising:
controlling a pulldown path to pull said output signal to said lower output voltage level in response to a first transition of said input signal, said first transition comprising one of a rising transition from said lower input voltage level to said higher input voltage level and a falling transition from said higher input voltage level to said lower input voltage level;

controlling a pullup path to pull said output signal to said higher output voltage level in response to a second transition of said input signal, said second transition comprising the other of said rising transition and said falling transition of said input signal;

placing said pullup path in a non-conductive state in response to said pullup path pulling said output signal to said higher output voltage level; and controlling a keeper path to keep said output signal at said higher output voltage level while said pullup path is in said non-conductive state until said pulldown path pulls said output signal to said lower output voltage level;

wherein a maximum drive current of said pulldown path is greater than a maximum drive current of said keeper path.

\* \* \* \* \*